United States Patent [19]

Takahashi et al.

[11] Patent Number: 5,221,594
[45] Date of Patent: Jun. 22, 1993

[54] PS PLATES REQUIRING NO DAMPENING WATER

[75] Inventors: Hiroshi Takahashi; Yoshihiko Urabe; Yukio Abe; Tsumoru Hirano, all of Shizuoka, Japan

[73] Assignee: Fuji Photo Film Co., Ltd., Minami-Ashigara, Japan

[21] Appl. No.: 853,333

[22] Filed: Mar. 16, 1992

Related U.S. Application Data

[63] Continuation of Ser. No. 555,061, Jul. 23, 1990, abandoned.

[30] Foreign Application Priority Data

Aug. 1, 1989 [JP] Japan .................................. 1-200040
Feb. 2, 1990 [JP] Japan .................................... 2-24197

[51] Int. Cl.$^5$ .......................... G03F 7/035; G03F 7/09
[52] U.S. Cl. ...................................... 430/272; 430/30; 430/906
[58] Field of Search ................................ 430/272, 303

[56] References Cited

U.S. PATENT DOCUMENTS 2,948,611  8/1960  Barney ........................... 430/906 X

FOREIGN PATENT DOCUMENTS 1441610  7/1976  United Kingdom ................ 430/303

Primary Examiner—Cynthia Hamilton
Attorney, Agent, or Firm—Burns, Doane, Swecker & Mathis

[57] ABSTRACT

A water-less PS plate for use in making a water-less lithographic printing plate comprises, on a substrate, a photopolymerizable light-sensitive layer and a silicone rubber layer in this order, wherein the light-sensitive layer is formed from a photopolymerizable light-sensitive composition which contains an urea bond-containing polyurethane as a binder. According to the present invention, there is obtained a water-less PS plate having good resistance to scratch and high printing durability. Moreover, the resulting light-sensitive layer does not get sticky, the light-sensitive layer of the non-image portions is not peeled off during the printing operations, and the lithographic plate shows good dyeability and plate-examination property.

21 Claims, No Drawings

PS PLATES REQUIRING NO DAMPENING WATER

This application is a continuation of application Ser. No. 07/555,601, filed Jul. 23, 1990 abandoned.

BACKGROUND OF THE INVENTION

The present invention relates to a presensitized plate requiring no dampening water for use in making a lithographic printing plate requiring no dampening water which permits printing without using any dampening water.

A lithographic printing plate which permits printing operations without using any dampening water (hereinafter referred to as "water-less lithographic printing plate") can be obtained by exposing a presensitized plate requiring no dampening water (hereinafter referred to as "water-less PS plate") to light and then developing the same with a developer. A variety of water-less PS plates have been proposed (see, for instance, Japanese Patent Publication for Opposition Purpose (hereunder referred to as "J.P. KOKOKU") Nos. Sho 44-23042, Sho 46-16044, Sho 51-17081, Sho 54-26923, and Sho 56-80046 and Sho 55-22781). Among them, a positive-working water-less PS plate in general has a light-sensitive layer comprising a photopolymerizable light-sensitive composition as described in J.P. KOKOKU Nos. Sho 54-26923 (U.S. Pat. No. 3,894,873) and Sho 56-23150.

Such a photopolymerizable light-sensitive layer in general has the following composition:

(1) an ethylenically unsaturated monomer or oligomer having a boiling point of not less than 100° C.;

(2) a photopolymerization initiator;

(3) an optional heat polymerization inhibitor; and (4) an optional polymer binder or inorganic powder used as a filler for maintaining the shape of the resulting light-sensitive layer.

The ethylenically unsaturated monomer or oligomer usually employed is a low molecular weight liquid or a solid having a low melting point and thus it is difficult to maintain predetermined hardness and thickness required for the light-sensitive layer, by simply using these ethylenically unsaturated monomers or oligomers.

For this reason, a polymer which has good compatibility with the ethylenically unsaturated monomer or oligomer is generally added to the light-sensitive composition as a polymer binder. Examples of such a polymer binder are vinyl polymers, (meth)acrylate polymers, unvulcanized rubbers, polyethers, polyamides, polyesters, polyurethanes, epoxy resins, urea resins and alkyd resins as disclosed in J.P. KOKOKU No. Sho 56-23150.

The inventors of this invention have conducted various studies of these polymers (hereunder referred to as "binder(s)") and have found out that a polyurethane of a polyol and a polyisocyanate is excellent as a binder and that the resulting water-less PS plate possessing the light-sensitive layer containing the binder exhibits in particular high resistance to scratch during plate-making processes and provides a water-less lithographic printing plate having high printing durability during printing processes.

However, if the foregoing polyurethane is used as a binder and the ethylenically unsaturated monomer or oligomer is employed in an amount greater than a predetermined level, the resulting light-sensitive layer becomes sticky and hence the problem of adhesion of the light-sensitive layer to rollers during plate-making processes arises. In addition, if the foregoing polyurethane is employed as a binder, various drawbacks arise. For instance, the adhesion of non-exposed portions of the light-sensitive layer to a substrate becomes insufficient, the light-sensitive layer of the non-exposed portions is peeled off during printing processes and, as a result, uneven image blinding occurs due to the difference in ink receptivities between the light-sensitive layer of the non-exposed areas and the substrate.

On the other hand, the plate-making process for water-less PS plates in general requires a step (step for checking the resulting plate) for dyeing the light-sensitive layer (so-called image portions) exposed through a development processing and for inspecting the dyed images in order to detect and/or confirm the reproduction of fine half-tone dots and the presence or absence of pinhole-like defects on the silicone rubber layer, but if this checking step is applied to the light-sensitive layer comprising the foregoing polyurethane as a binder, a sufficient density of the dye cannot be obtained.

SUMMARY OF THE INVENTION

Accordingly, a primary object of the present invention is to provide a water-less PS plate which is excellent in resistance to scratch during the plate-making processes and which can provide a water-less lithographic printing plate having good printing durability.

A second object of the present invention is to provide a water-less PS plate whose light-sensitive layer does not become sticky and which can provide a water-less lithographic printing plate whose light-sensitive layer of non-exposed portions is not peeled off.

A third object of the present invention is to provide a water-less PS plate excellent in plate-examination property through dyeing.

The inventors of this invention have conducted various studies and have found out that the foregoing objects can be attained by the use of a specific polyurethane as a binder for the light-sensitive layer of a water-less PS plate. The present invention has been completed based on this finding.

Namely, according to the present invention, there is provided a water-less PS plate for use in making a water-less lithographic printing plate which comprises, on a substrate, a light-sensitive layer and a silicone rubber layer, in this order, the light-sensitive layer comprising a photopolymerizable light-sensitive composition containing an urea bond-containing polyurethane as a binder.

DETAILED EXPLANATION OF THE INVENTION

The water-less PS plate of the present invention will hereinafter be described in more detail.

The substrate used for the water-less PS plate of the present invention must have flexibility which is sufficient for the plate to set on the usual printing press and must withstand the load applied during printing operations. For this reason, typical examples thereof are coated paper, metal plates such as an aluminum plate, plastic films such as a polyethylene terephthalate film or a composite substrate thereof.

A primer layer or the like can optionally be provided on the surface of the substrate for the purposes of forming a uniform light-sensitive layer thereon and of improving the adhesion between the light-sensitive layer and the substrate. Examples of the materials for such primer layers are those containing epoxy resins as disclosed in J.P. KOKOKU No. Sho 61-54219, urethane resins, phenol resins, acrylic resins, alkyd resins, polyesters, polyamides and melamine resins. Moreover, the primer layer may be formed by photohardening a composition similar to the light-sensitive composition. The primer layer may further comprise additives such as dyes and pigments in order to prevent halation and for other various purposes.

The light-sensitive composition used in the present invention is a photopolymerizable light-sensitive composition containing an urea bond-containing polyurethane as a binder and in general has the following composition:
(1) an ethylenically unsaturated monomer or oligomer having a boiling point of not less than 100° C.;
(2) a photopolymerization initiator;
(3) an optional heat polymerization inhibitor; and
(4) an urea bond-containing polyurethane as a polymer binder.

Examples of the ethylenically unsaturated monomers usable in the present invention include (meth)acrylates of alcohols such as methanol, ethanol, propanol, hexanol, octanol, cyclohexanol, ethylene glycol, propylene glycol, diethylene glycol, triethylene glycol, polyethylene glycol, glycerin, trimethylol propane and pentaerythritol; reaction products of glycidyl (meth)acrylates with amines such as methylamine, ethylamine, butylamine, benzylamine, ethylenediamine, diethylenetriamine, hexamethylenediamine, xylylenediamine, ethanolamine, dimethylamine, diethylamine, diethanolamine and aniline; reaction products of glycidyl (meth)acrylates with carboxylic acids such as acetic acid, propionic acid, benzoic acid, (meth)acrylic acids, succinic acid, maleic acid, phthalic acid, tartaric acid and citric acid; and amide derivatives such as (meth)acrylamides, N-methylolacrylamide, methylenebisacrylamide and diacetoneacrylamide.

The foregoing ethylenically unsaturated monomers and oligomers can be used alone or as a combination of at least two of them and the amount thereof suitably ranges from 20 to 90% by weight and preferably 30 to 70% by weight on the basis of the total weight of the light-sensitive layer.

Examples of the photopolymerization initiators usable in the present invention are benzophenone and derivatives thereof such as bis(dialkylamino)benzophenone; benzoin and derivatives thereof such as benzoin alkyl ethers; and aromatic carbonyl compounds such as 9-acridone, thioxanthone, 2-chlorothioxanthone and N-methyl-9-acridone. These photopolymerization initiators may be used alone or as a combination thereof and the amount thereof used suitably ranges from 1 to 20% by weight, preferably 5 to 15% by weight on the basis of the total weight of the light-sensitive layer.

Examples of the polymerization inhibitors employed in the light-sensitive composition are hydroquinone and derivatives thereof; phenol derivatives; nitro-substituted benzene; and tertiary aminopheno-thiazine and derivatives thereof.

The urea bond-containing polyurethane used in the present invention may be any polyurethanes so far as they contain urea bonds in the molecule, but preferably those having ester bonds and/or ether bonds in the molecule in addition to the urea bonds. The urea bond-containing polyurethane used in the present invention can be prepared by reacting a diisocyanate compound represented by the following general formula (I), with a diol compound represented by the following general formula (II) and a diamine compound represented by the following general formula (III):

Diisocyanate Compounds:

$$OCN—R_1—NCO \qquad (I)$$

wherein $R_1$ represents a divalent aliphatic or aromatic hydrocarbon coupling group which may be substituted by alkyl, aralkyl, aryl and/or alkoxy groups and/or halogen atoms.

Diol Compounds:

$$HO—R_2—OH \qquad (II)$$

wherein $R_2$ represents a divalent aliphatic or aromatic hydrocarbon coupling group which may be substituted by alkyl, aralkyl, aryl and/or alkoxy groups and/or halogen atoms and which may optionally comprise an ester or ether bond in the molecule.

Diamine Compounds:

$$H_2N—R_3—NH_2 \qquad (III)$$

wherein $R_3$ represents a divalent aliphatic or aromatic hydrocarbon coupling group which may be substituted by alkyl, aralkyl, aryl and/or alkoxy groups and/or halogen atoms.

Specific examples of the diisocyanate compounds represented by Formula (I) include the following compounds, but the present invention is not restricted to these specific examples:
2,4-tolylenediisocyanate, 2,6-tolylenediisocyanate, p-xylylenediisocyanate, m-xylylenediisocyanate, 4,4'-diphenylmethanedi-isocyanate, 1,5-naphthylenediisocyanate, 3,3'-dimethylbiphenyl-4,4'-diisocyanate, hexamethylenediisocyanate, isophoronediisocyanate and 4,4'-methylenebis (cyclohexylisocyanate).

These diisocyanate compounds may be used alone or as a combination of two or more of them.

Specific examples of the diol compounds represented by Formula (II) include the following compounds, but the present invention is not restricted to these specific examples:
ethylene glycol, diethylene glycol, triethylene glycol, propylene glycol, polyethylene glycol, polypropylene glycol, neopentyl glycol, 1,4-butanediol, 1,3-butanediol, 1,6-hexanediol, hydrogenated bisphenol A, ethylene oxide adducts of hydrogenated bisphenol A, and polyester diols such as copolymers of adipic acid with propylene glycol and copolymers of adipic acid with ethylene glycol and 1,4-butanediol.

These diol compounds may be used alone or as a combination of two or more of them.

Particularly preferred diol compounds are the foregoing polyester diols (in particular, those having a molecular weight ranging from 1,000 to 3,000) and polyether diols (for instance, polyethylene glycol and polypropylene glycol, preferably those having a molecular weight ranging from 1,000 to 10,000) and thus polyurethanes having a urea bond and an ester and/or ether bond which are preferred embodiments of the present invention can be obtained. In this case, it is particularly preferred to simultaneously use the foregoing polyether diol and/or polyester diol and low molecular weight diols such as ethylene glycol, diethylene glycol, triethylene glycol, propylene glycol, neopentyl glycol, 1,4-butanediol, 1,3-butanediol and/or 1,6-hexanediol.

Specific examples of the amine compounds represented by Formula (III) include the following compounds, but the present invention is not restricted to these specific examples and these amine compounds may be used alone or as a combination of two or more of them:

ethylenediamine, 1,4-tetramethylenediamine, 1,6-hexamethylene-diamine, isophoronediamine, m-xylylenediamine, p-xylylenediamine, 4,4'-diaminodiphenylmethane, 4,4'-diaminodiphenyl ether and 4,4'-methylenebis(2-chloroaniline). Among them, preferred are ethylenediamine, 1,4-tetramethylenediamine, 1,6-hexamethylene-diamine and isophoronediamine.

The urea bond-containing polyurethanes used in the present invention can in general be prepared by heating a mixture of the foregoing diisocyanate, diol compound and diamine compound in an aprotic solvent in the presence of a known catalyst having activity selected depending on the reactivity of these components, but preferably they are prepared by first reacting the diisocyanate compound with the diol compound to form a prepolymer and then reacting the prepolymer with the diamine compound.

In the foregoing preparation of the polyurethane, the molar ratio of the sum of the diol compound and the amine compound to the diisocyanate compound preferably ranges from 0.8:1 to 1.2:1. If an isocyanate group remains at a terminus of the polymer after the reaction, the polymer is treated with alcohols, amines or water so that an isocyanate group does not remain in the polymer. The molar ratio of the diol compound to the diamine compound preferably ranges from 0.1:0.9 to 0.9:0.1 and more preferably 0.2:0.8 to 0.8:0.2.

The molecular weight of the urea bond-containing polyurethane used in the present invention is not less than 5,000 and preferably 10,000 to 200,000 expressed in the weight average molecular weight.

The weight ratio of the urea bond-containing polyurethane to the ethylenically unsaturated monomer or oligomer in the light-sensitive composition used in the present invention ranges from 1:0.1 to 1:5 and preferably 1:0.2 to 1:2.

The light-sensitive composition used in the present invention may comprise a variety of plasticizers for various purposes such as improvement in the developability and the control of physical properties of the resulting photohardenable light-sensitive layer.

The thickness of the light-sensitive layer explained above is not critical, but it is desirably limited to the range of from 1 to 10μ from the viewpoint of uniformity of the resulting film and from economical point of view.

The silicone rubber layer preferably used in the present invention is formed from a linear or partially cross-linked poly-diorganosiloxane which comprises the following repeating units:

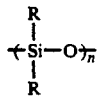

wherein R's represent a monovalent group selected from the group consisting of alkyl, aryl, alkenyl groups and combination thereof, which may be substituted with functional groups such as halogen atoms, amino groups, hydroxyl group, alkoxy groups, aryloxy groups, (meth)acryloxy groups and/or thiol groups. The silicone rubber layer may optionally comprise other additives such as fine powder of inorganic substances (for instance, silica, calcium carbonate and titanium oxide); auxiliary agents for adhesives (for instance, silane coupling agents, titanate type coupling agents and aluminum type coupling agents); and photopolymerization initiators.

The silicone rubber layer can be obtained by crosslinking a polysiloxane having functional groups at the termini and a molecular weight ranging from several thousands to several hundreds of thousands as a starting material for the polymer (silicone rubber) having the foregoing polysiloxane as a principal skeleton according to the method as will be described below. More specifically, the crosslinking method comprises mixing the foregoing polysiloxane having, for instance, a hydroxyl group on either or both termini thereof with a silane type crosslinking agent represented by the following general formula and then heating the mixture or condensing and hardening the mixture at ordinary temperature optionally in the presence of a catalyst such as an organometal compound (e.g., an organotin compound), an inorganic acid or an amine:

$$R_n SiX_{4-n}$$

wherein n is an integer ranging from 1 to 3; R is the same as that defined above; X represents —OH, —OR$^1$, —OAc, —O—N=CR$^1$R$^2$, —Cl, —Br or —I; R$^1$ and R$^2$ are the same as those defined above and may be the same or different; and Ac represents an acetyl group.

Alternatively, the foregoing polysiloxane and a polyvalent hydrogen organopolysiloxane crosslinking agent are condensed and hardened optionally in the presence of the foregoing silane type crosslinking agent.

Moreover, it is also effective to use addition-type silicone rubber layer which is crosslinked through an addition reaction of an—→SiH group with a CH$_2$=CH— group. The addition-type silicone rubber is resistive to the influence of humidity during the hardening operation, can be crosslinked at a high speed, and can easily provide a silicone rubber layer having desired physical properties after the crosslinking operation. The addition-type silicone rubber layer used herein can be obtained through a reaction of a polyvalent hydrogen organopolysiloxane with a polysiloxane compound having at least two CH$_2$=CH— bonds per molecule and preferably obtained by hardening and crosslinking a composition comprising the following components:

(1) 100 parts by weight of an organopolysiloxane having at least two alkenyl groups (more preferably vinyl groups) which are directly bonded to silicon atoms in a molecule;

(2) 0.1 to 1,000 parts by weight of an organo hydrogen polysiloxane having at least two—→SiH bonds in one molecule; and (3) 0.00001 to 10 parts by weight of a catalyst for the addition reaction.

The alkenyl groups of the component (1) may be present at either the middle or the ends of the molecular chain and the component may have an organic group other than the alkenyl groups, such as substituted or unsubstituted alkyl and/or aryl groups. The component (1) may optionally comprise a small amount of hydroxyl groups. The component (2) can react with the component (1) to form a silicone rubber layer and it further serves to improve the adhesion between the silicone rubber layer and the light-sensitive layer. The hydroxyl groups of the component (2) may exist at either the middle or the ends of the molecular chain and the component (2) may have an organic group other than the hydroxyl groups, such as those listed above in connection with the component (1). At least 60% of the total organic groups of the components (1) and (2) is preferably a methyl group from the viewpoint of improvement in ink repellency of the resulting silicone rubber layer. The molecular structures of the components (1) and (2) may be either of linear, cyclic and branched ones. Moreover, the molecular weight of either one of them is preferably not less than 1,000 from the viewpoint of the physical properties of the resulting silicone rubber layer and more preferably that of the component (1) should be not less than 1,000.

Examples of the component (1) are $\alpha$, $\omega$-divinyl polydimethylsiloxane and (methylvinylsiloxane) (dimethylsiloxane) copolymers having methyl groups at both ends; and examples of the component (2) are polydimethylsiloxane having methyl groups at both ends, $\alpha$, $\omega$-dimethyl-poly(methyl hydrogen siloxane), (methyl hydrogen siloxane)(dimethyl siloxane) copolymers having methyl groups at both ends and cyclic poly(methyl hydrogen siloxane).

The catalyst for addition reaction (component (3)) may freely be selected from known ones, but is preferably platinum type compounds such as elemental platinum, platinum chloride, chloroplatinic acid and platinum coordinated with olefins. The composition for forming silicone rubber layer may further comprise crosslinking-inhibiting agents such as vinyl group-containing organopolysiloxanes (e.g., tetracyclo(methylvinyl) siloxane), carbon-carbon triple bond-containing alcohols, acetone, methyl ethyl ketone, methanol, ethanol and propylene glycol monomethyl ether.

The composition initiates an addition reaction immediately after the mixing of these three components and the hardening speed thereof rapidly increases in proportion to the increase in the reaction temperature. Therefore, the pot life of the composition must be extended and the time required for the composition to be hardened on the light-sensitive layer must be reduced. For these reasons and for achieving stable adhesion between the light-sensitive layer and the rubber layer, the composition should be hardened at a temperature at which properties of the substrate and the light-sensitive layer do not cause any change and it should be maintained at that high temperature till it is completely hardened.

In addition to the foregoing components, the composition may further comprise known adhesion imparting agents such as alkenyl trialkoxy silane; hydroxyl group-containing organopolysiloxanes which are components for condensation-type silicone rubber layers; hydrolyzable functional group-containing silanes (or siloxanes); and known fillers such as silica for improving the strength of the resulting rubber layer.

In the present invention, the silicone rubber layer serves as an ink repellent layer. If it is too thin, the ink repellency of the resulting layer is lowered and defects are easily formed, while if it is too thick, the developability of the resulting PS plate is impaired. Therefore, the thickness thereof preferably ranges from 0.5 to 5 $\mu$m.

The water-less PS plate explained above may further comprise various silicone rubber layers applied onto the foregoing silicone rubber layer and it may also comprise an adhesive layer between the light-sensitive layer and the silicone rubber layer for the purposes of enhancing the adhesion therebetween and of preventing the poisoning of the catalyst present in the silicone rubber composition. To protect the surface of the silicone rubber layer, a transparent film may be laminated on the silicone rubber layer or a polymer coating may be applied thereto. Examples of such films or polymer coatings are polyethylene, polypropylene, polyvinyl chloride, polyvinylidene chloride, polyvinyl alcohol, polyethylene terephthalate and cellophane films.

The water-less PS plate of the present invention is first exposed to light through an original and then developed with a developer capable of dissolving a part of the light-sensitive layer of the image portions or of swelling a part or whole thereof, or of swelling the silicone rubber layer. In this case, a part of the light-sensitive layer of the image portions and the silicone rubber layer thereof are removed, or only the silicone rubber layer of the image portions is removed, either of which is encountered depending on the strength of the developer used.

As the developers used in the present invention, any known developers for water-less PS plates can be employed. Examples thereof include aliphatic hydrocarbons such as hexane, heptane, "Isopar E, H, G" (trade names of aliphatic hydrocarbons available from ESSO CHEMICAL CO., LTD.), gasoline, kerosine, aromatic hydrocarbons such as toluene and xylene, and halogenated hydrocarbons such as trichlene, to which at least one polar solvent listed below is added.

Alcohols such as methanol, ethanol, propanol, benzyl alcohol, ethylene glycol monophenyl ether, 2-methoxyethanol, 2-ethoxyethanol, carbitol monoethyl ether, carbitol monomethyl ether, triethylene glycol monoethyl ether, propylene glycol monomethyl ether, propylene glycol monoethyl ether, dipropylene glycol monomethyl ether, polyethylene glycol monomethyl ether, propylene glycol, polypropylene glycol, triethylene glycol and tetraethylene glycol;

Ketones such as acetone and methyl ethyl ketone;

Esters such as ethyl acetate, methyl lactate, ethyl lactate, butyl lactate, propylene glycol monomethyl ether acetate, carbitol acetate, dimethyl phthalate and diethyl phthalate.

The development is performed, for instance, by rubbing the surface of the plate with a pad for development containing such a developer to thus remove the silicone rubber layer of the image portions whereby the light-sensitive layer is exposed and the exposed light-sensitive layer serves as ink receiving portions.

Alternatively, it is also possible to adopt a method for development as disclosed in J. P. KOKOKU No. Sho 63-33140, which method comprises dissolving out a part or whole of the light-sensitive layer of the images with a processing solution capable of dissolving at least part of the light-sensitive layer of the images and then rubbing the surface of the plate in the presence of water which does not swell the silicone rubber layer or a solvent mainly comprising water, to thus remove the silicone rubber layer of the images.

To confirm the image-forming ability of the resulting lithographic printing plate, the plate-checking process is performed by dyeing the exposed image portions (the light-sensitive layer) with a dyeing solution. Only the exposed image portions of the light-sensitive layer are dyed by lightly rubbing the image portions with a soft pad soaked with the dyeing solution. Thus, it can be confirmed whether even the highlight portions are sufficiently developed or not. As such a dyeing solution, there may be used, for instance, those obtained by dissolving at least one member selected from the group consisting of water-soluble disperse dyes, acid dyes and basic dyes in a solvent such as water, alcohols, ketones, ethers or mixture thereof. It is also effective to add carboxylic acids, amines, surfactants and/or auxiliary dyeing agents to the dyeing solution in order to enhance the dyeing ability of the solution.

Since the light-sensitive layer of the water-less PS plate of the present invention contains an urea bond-containing polyurethane as a binder, the water-less lithographic plate obtained by exposing to light and developing the PS plate has good resistance to scratch and high printing durability. Moreover, the resulting light-sensitive layer does not get sticky, the light-sensitive layer of the non-image portions is not peeled off during the printing operations, and the light-sensitive layer of images shows good dyeability and plate-examination properties.

EXAMPLE

The present invention will hereunder be explained in more detail with reference to the following non-limitative working Examples and Preparation Examples and the effects practically achieved by the present invention will also be discussed in detail in comparison with Comparative Examples.

PREPARATION EXAMPLE 1

200 Parts by weight of a commercially available polyester (ODX-105: adipic acid/ethylene glycol/1,4-butanediol=1/0.5/0.5 (molar ratio); available from DAINIPPON INK AND CHEMICALS, INC.), 18 parts by weight of 1,4-butanediol and 112.2 parts by weight of isophorone diisocyanate were dissolved in 1458.4 parts by weight of dimethylacetamide and the addition polymerization of these monomers was performed at 100° C. for 2 hours in the presence of dilauric acid-n-butyl tin as a catalyst in the usual manner. Moreover, 34.5 parts by weight of isophoronediamine as a chain extender was added to the polymerized mixture and the reaction was continued for additional one hour at 100° C. to complete the reaction. The composition of the urea bond-containing polyurethane resin is detailed in the following Table I (see Example 1; expressed as charge stock ratio (molar ratio)). Separately, the urea bond-containing polyurethanes used in Examples 2 and 3 were also prepared in the same manner as used above. Further, the binders used in Comparative Examples 1 and 2 were also prepared according to the first step of the foregoing method for the preparation of the polyurethanes.

EXAMPLES 1 TO 3 AND COMPARATIVE EXAMPLES 1 TO 2

A titanium white dispersion having the following composition was applied onto the surface of a smooth aluminum plate, which had been degreased in the usual manner, with a bar coater and heated at 200° C. for 20 minutes to form a primer layer. The coated amount of the primer layer was 2.0 g/m² (weighed after drying).

| Titanium White Dispersion | |
| --- | --- |
| Component | Amount (part by weight) |
| Epoxy resin (Epikote 1007; available from SHELL OIL CO., LTD) | 10 |
| TiO$_2$ powder (TIPAQUE R-782; available from ISHIHARA SANGYO CO., LTD.) | 1 |
| Ethyl cellosolve acetate | 40 |
| Ethyl cellosolve | 40 |
| Butyl cellosolve | 20 |

Five kinds of photopolymerizable light-sensitive compositions having the following compositions were prepared using five kinds of binders having the charge stock ratios shown in Table I and they were applied onto the surface of these five aluminum plates, to which the foregoing primer layer had been applied, in an amount of 4.0 g/m² (on dry basis) to thus form light-sensitive layers.

| Photopolymerizable Light-sensitive Layer | |
| --- | --- |
| Component | Amount (part by weight) |
| Polyurethane urea or polyester urethane having a charge stock ratio shown in Table I (a 20% by weight solution in dimethylacetamide) | 7.5 |
| Michler's ketone | 0.16 |
| 2-Chloro-thioxanthone | 0.05 |
| 2-Chloro-N-butyl-acridone | 0.17 |
| Reaction product of m-xylylenediamine with glycidyl methacrylate (molar ratio: 1:4) | 0.9 |
| CH$_2$=CHCOO(CH$_2$CH$_2$O)$_4$COCH=CH$_2$ | 0.6 |
| Victoria Pure Blue NPS (available from HODOGAYA CHEMICAL CO., LTD.) | 0.01 |
| Defenser MCF 323 (available from DAINIPPON INK AND CHEMICALS, INC.) | 0.005 |
| Methyl ethyl ketone | 5.0 |
| Propylene glycol monomethyl ether | 35.0 |

The surface of these five light-sensitive layers thus prepared were lightly pressed with a finger and examined on whether the finger marks were left thereon or not. The results thus obtained are summarized in Table I.

A silicone rubber composition having the following composition was applied onto each light-sensitive layer of these five water-less PS plates in an amount of 2.0 g/m² (on dry basis) to thus form hardened silicone rubber layer.

| Silicone Rubber Composition | |
| --- | --- |
| Component | Amount (part by weight) |
| Dimethylpolysiloxane having hydroxyl groups on both ends (molecular weight = about 70,000) | 90 |
| Methyl triacetoxysilane | 3 |
| Dibutyl-tin-dioctanoate | 1 |
| Isopar G (available from Exxon Chemical Co., Ltd.) | 140 |

An OPP (biaxially oriented polypropylene) film having a thickness of 9 μm, one surface of which had been matted, was laminated on each silicone rubber layer of the water-less PS plates prepared above to thus obtain water-less PS plates of Examples 1 to 3 and Comparative Examples 1 and 2.

A positive film was put on each of the foregoing of waterless PS plates, brought into close contact with one another in vacuo, the resulting assembly was imagewise exposed to light with the usual exposure machine, the laminated OPP film was peeled off and the exposed plate was immersed in polypropylene glycol (molecular weight 200) maintained at 40° C. for one minute. After the immersion, the processing solution remaining on the plate surface and the back side thereof was removed with a squeegee of rubber. Then the plate was lightly rubbed with a pad, while spraying tap water thereon, to peel off the silicone rubber layer of the image portions. Subsequently, the plate was dyed with a dyeing solution having the following composition and the dyeing density of the image portions (solid portions) was examined with a reflection densitometer (Macbeth RD 920). The results obtained are listed in Table I given below.

| Dyeing Solution | |
|---|---|
| Component | Amount (part by weight) |
| Crystal Violet | 0.1 |
| Carbitol | 14.0 |
| Pionine D-310 (polyoxyethylene octylphenyl ether HLB: 13.6; available from Takemoto Oil & Fats Co., Ltd.) | 0.5 |
| New coal B4SN (available from NIPPON EMULSIFYING AGENT CO., LTD.): | 1.8 |

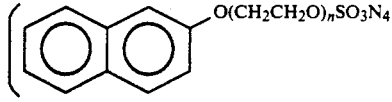

(n = 4.2)

| Pure water | 83.1 |

The water-less lithographic printing plate thus obtained was fitted to KOMORI LITHRONE 26 Printing Press, of which the device for supplying dampening water was dismantled, and printing operation was performed with Aqualess V-G Sumi Ink (available from Toyo Ink Manufacturing Co., Ltd.) to thus give 10,000 printed matters. Thereafter, the printing plate was examined on whether the light-sensitive layer of the images wore out or not. The results thus observed are listed in Table I.

TABLE I

| Example No. | Ex. 1 | Ex. 2 | Ex. 3 | Comp.1 | Comp.2 |
|---|---|---|---|---|---|
| (i) Charge Stock Molar Ratio | | | | | |
| Isophorone-diisocyanate | 1 | 1 | 1 | 1 | 1 |
| ODX-105 | 0.2 | 0.2 | 0.2 | 0.2 | 0.5 |
| 1,4-Butanediol | 0.4 | | | 0.8 | |
| Ethylene glycol | | 0.4 | | | 0.5 |
| Ethylenediamine | | 0.4 | | | |
| Isophoronediamine | 0.4 | | 0.8 | | |
| (ii) Evaluation | | | | | |
| Finger Marks on the Surface of the Light-sensitive Layer | none | none | none | formed | formed |
| Dyeing Density on the Images | 1.43 | 1.43 | 1.45 | 1.03 | 1.36 |
| Wear on the Light -sensitive observed Layer after 10,000 Printing | none | none | none | none | observed |

EXAMPLE 4

An aluminum plate, to which a primer layer was applied in the same manner as in Examples 1 to 3, was prepared. Separately, a binder having the charge stock ratio (molar ratio) defined below was prepared in the same manner as in Preparation Example 1, and a light-sensitive solution containing the photopolymerizable light-sensitive composition having the following formulation and containing the binder was prepared. The light-sensitive solution was applied onto the surface of the aluminum plate in an amount of 4.0 g/m² (on dry basis).

| Light-sensitive Solution | |
|---|---|
| Component | Amount (part by weight) |
| Isophoronediisocyanate/EG 6000*/1,4-butanediol/isophoronediamine polyurethane urea (charge stock ratio = 1.0/0.2/0.4/0.4; MEK solution: (12.46% by weight)) | 12.04 |
| Ethyl Michler's ketone | 0.14 |
| 2-Chloro-thioxanthone | 0.10 |
| Reaction product of m-xylylenediamine with glycidyl methacrylate (molar ratio = 1:4) | 0.9 |
| $CH_2=CHCOO(CH_2CH_2O)_4COCH=CH_2$ | 0.6 |
| Victoria Pure Blue NPS (available from HODOGAYA CHEMICAL CO., LTD.) | 0.01 |
| Defenser MCF 323 (available from DAINIPPON INK AND CHEMICALS, INC.) | 0.005 |
| Methyl ethyl ketone | 5.0 |
| Propylene glycol monomethyl ether | 35.0 |

*Polyethylene glycol (molecular weight: 7,500; available from WAKO PURE CHEMICALS, INC.).

Even when the surface of the resulting light-sensitive layer was lightly pressed with a finger, it did not get sticky and no finger mark was left or observed.

The same silicone rubber composition as used in Examples 1 to 3 was applied onto the foregoing light-sensitive layer so that the coated amount thereof was 2.0 g/m² (on dry basis) and then dried to form a hardened silicone rubber layer.

An OPP (biaxially oriented polypropylene) film having a thickness of 9 μm, one surface of which had been matted was laminated on the silicone rubber layer of the water-less PS plates prepared above to thus obtain a water-less PS plate.

A water-less lithographic printing plate was prepared from the water-less PS plate thus obtained in the same manner as in Examples 1 to 3.

The dyeing density of the resulting lithographic plate was examined and it was found to be 1.39.

10,000 copies were prepared using the water-less lithographic printing plate thus obtained under the same conditions as in Examples 1 to 3, then the degree of wear of the light-sensitive layer on the images was examined and it was confirmed that any wear was not observed.

What is claimed is:

1. A presensitized plate requiring no dampening water for use in making a lithographic printing plate requiring no dampening water which comprises, on an aluminum plate, a photopolymerizable light-sensitive layer and a silicone rubber layer in this order, wherein said light-sensitive layer is formed from a photopolymerizable light-sensitive composition having the following composition:

(1) an ethylenically unsaturated monomer or oligomer having a boiling point of not less than 100° C.;
(2) a photopolymerization initiator; and
(3) a urea bond-containing polyurethane as a polymer binder.

2. The presensitized plate of claim 1 wherein said polyurethane further comprises an ester bond and/or ether bond.

3. The presensitized plate of claim 1 wherein said urea bond-containing polyurethane is prepared by reacting a diisocyanate compound represented by the following general formula (I) with a diol compound represented by the following general formula (II) and a diamine compound represented by the following general formula (III):

$$OCN-R_1-NCO \quad (I)$$

wherein $R_1$ represents a divalent aliphatic or aromatic hydrocarbon group which is optionally substituted by an alkyl, aralkyl, aryl and/or alkoxy group and/or a halogen atom;

$$HO-R_2-OH \quad (II)$$

wherein $R_2$ represents a divalent aliphatic or aromatic hydrocarbon group which is optionally substituted by an alkyl, aralkyl, aryl and/or alkoxy group and/or a halogen atom and which optionally comprises an ester or ether bond in the molecule;

$$H_2N-R_3-NH_2 \quad (III)$$

wherein $R_3$ represents a divalent aliphatic or aromatic hydrocarbon group which is optionally substituted by an alkyl, aralkyl, aryl and/or alkoxy group and/or a halogen atom.

4. The presensitized plate of claim 3 wherein said diisocyanate compound represented by Formula (I) is at least one member selected from the group consisting of 2,4-tolylenediisocyanate, 2,6-tolylenediisocyanate, p-xylylenediisocyanate, m-xylylenediisocyanate, 4,4'-diphenylmethanediisocyanate, 1,5-naphthylenediisocyanate, 3,3'-dimethylbiphenyl-4,4'-diisocyanate, hexamethylenediisocyanate, isophoronediisocyanate and 4,4'-methylenebis(cyclohexylisocyanate).

5. The presensitized plate of claim 3 wherein said diol compound represented by Formula (II) is at least one member selected from the group consisting of ethylene glycol, diethylene glycol, triethylene glycol, propylene glycol, polyethylene glycol, polypropylene glycol, neopentyl glycol, 1,4-butanediol, 1,3-butanediol, 1,6-hexanediol, hydrogenated bisphenol A, ethylene oxide adduct of hydrogenated bisphenol A, and polyester diols of adipic acid with propylene glycol and 1,4-butanediol.

6. The presensitized plate of claim 5 wherein said diol compound represented by Formula (II) is a polyester diol having a molecular weight ranging from 1,000 to 3,000 or a polyether diol having a molecular weight ranging from 1,000 to 10,000.

7. The presensitized plate of claim 5 wherein said diol compound comprises a polyether diol and/or polyester diol together with a low molecular weight diol selected from the group consisting of ethylene glycol, diethylene glycol, triethylene glycol, propylene glycol, neopentyl glycol, 1,4-butanediol, 1,3-butanediol and 1,6-hexanediol.

8. The presensitized plate of claim 3 wherein said amine compound represented by Formula (III) is at least one member selected from the group consisting of ethylenediamine, 1,4-tetramethylenediamine, 1,6-hexamethylenediamine, isophoronediamine, m-xylylenediamine, p-xylylenediamine, 4,4'-diaminodiphenylmethane, 4,4'-diaminodiphenyl ether and 4,4'-methylenebis(2-chloroaniline).

9. The presensitized plate of claim 3 wherein said urea bond-containing polyurethane is prepared by reacting the diisocyanate compound with the diol compound to form a prepolymer and then reacting the prepolymer with the diamine compound.

10. The presensitized plate of claim 3 wherein the molar ratio of the sum of the diol compound and the amine compound to the diisocyanate compound ranges from 0.8:1 to 1.2:1.

11. The presensitized plate of claim 3 wherein the molar ratio of the diol compound to the diamine compound ranges from 0.1:0.9 to 0.9:0.1.

12. The presensitized plate of claim 3 wherein said molecular weight of the urea bond-containing polyurethane ranges from 10,000 to 200,000 expressed in the weight average molecular weight.

13. The presensitized plate of claim 1 wherein the weight ratio of the urea bond-containing polyurethane to the ethylenically unsaturated monomer or oligomer ranges from 1:0.1 to 1:5.

14. The presensitized plate of claim 13 wherein the weight ratio of the urea bond-containing polyurethane to the ethylenically unsaturated monomer or oligomer ranges from 1:0.2 to 1:2.

15. The presensitized plate of claim 1 wherein a primer layer is further provided between the aluminum plate and light-sensitive layer, the primer layer comprising an epoxy resin, a phenol resin, an acrylic resin, an alkyd resin, a polyester resin, a polyamide resin, or a melamine resin.

16. The presensitized plate of claim 15 wherein the primer layer comprises a dye or a pigment in an amount sufficient to prevent halation.

17. The presensitized plate of claim 1 wherein the photopolymerization initiator is at least one selected from aromatic carbonyl compounds.

18. The presensitized plate of claim 1 wherein the silicone rubber layer is a hardened and crosslinked product of a composition comprising:
(1) 100 parts by weight of an organopolysiloxane having at least 2 alkenyl groups which are directly bonded to silicon atoms in a molecule;
(2) 0.1 to 1,000 parts by weight of an organo hydrogen polysiloxane having at least 2≡SiH bonds in one molecule; and
(3) 0.00001 to 10 parts by weight of a catalyst for the addition reaction.

19. The presensitized plate of claim 1 wherein the light-sensitive layer has a thickness of from 1 to 10 μm and the silicone rubber layer has a thickness of from 0.5 to 5 μm.

20. The presensitized plate of claim 1 wherein a transparent film is laminated on the silicone rubber layer.

21. The presensitized plate of claim 1 wherein a primer layer is further provided between the aluminum plate and the light-sensitive layer, the primer layer comprising a photohardened composition of the photopolymerizable light-sensitive composition.

* * * * *